US009716176B2

(12) United States Patent
Rodder et al.

(10) Patent No.: US 9,716,176 B2
(45) Date of Patent: Jul. 25, 2017

(54) FINFET SEMICONDUCTOR DEVICES INCLUDING RECESSED SOURCE-DRAIN REGIONS ON A BOTTOM SEMICONDUCTOR LAYER AND METHODS OF FABRICATING THE SAME

(71) Applicants: Mark S. Rodder, Dallas, TX (US); Borna J. Obradovic, Leander, TX (US); Robert C. Bowen, Austin, TX (US)

(72) Inventors: Mark S. Rodder, Dallas, TX (US); Borna J. Obradovic, Leander, TX (US); Robert C. Bowen, Austin, TX (US)

(73) Assignee: Samsung Electronics Co., Ltd. (KR)

(*) Notice: Subject to any disclaimer, the term of this patent is extended or adjusted under 35 U.S.C. 154(b) by 96 days.

(21) Appl. No.: 14/534,453

(22) Filed: Nov. 6, 2014

(65) Prior Publication Data

US 2015/0145003 A1     May 28, 2015

Related U.S. Application Data

(60) Provisional application No. 61/908,905, filed on Nov. 26, 2013.

(51) Int. Cl.
   *H01L 29/78*   (2006.01)
   *H01L 27/12*   (2006.01)
   *H01L 21/84*   (2006.01)
   *H01L 29/66*   (2006.01)

(52) U.S. Cl.
   CPC .......... *H01L 29/785* (2013.01); *H01L 21/845* (2013.01); *H01L 27/1211* (2013.01); *H01L 29/66795* (2013.01); *H01L 29/7848* (2013.01)

(58) Field of Classification Search
   CPC . H01L 29/785; H01L 21/845; H01L 27/1211; H01L 29/165; H01L 29/6681; H01L 29/66795; H01L 29/7848
   See application file for complete search history.

(56) References Cited

U.S. PATENT DOCUMENTS

| 5,374,564 | A  | 12/1994 | Bruel |
| 6,413,802 | B1 | 7/2002  | Hu et al. |
| 7,221,006 | B2 | 5/2007  | Orlowski et al. |
| 7,368,358 | B2 | 5/2008  | Ouyang et al. |
| 7,829,421 | B2 | 11/2010 | Wei et al. |

(Continued)

FOREIGN PATENT DOCUMENTS

| WO | WO 2013/095349 A1 | 6/2013 |
| WO | WO 2013/095384 A1 | 6/2013 |

OTHER PUBLICATIONS

Hu et al. "Comparative leakage analysis of GeOI FinFET and Ge bulk FinFET", *IEEE Transactions on Electron Devices*, vol. 60, No. 10, pp. 3596-3600, Oct. 2013.

(Continued)

*Primary Examiner* — Peter Bradford
(74) *Attorney, Agent, or Firm* — Myers Bigel, P.A.

(57) ABSTRACT

FinFET semiconductor devices and methods of forming the same are provided. The finFET semiconductor devices may include an insulator layer, a bottom semiconductor layer on the insulator layer, a channel fin on the bottom semiconductor layer, a source region on the bottom semiconductor layer and adjacent a first side of the channel fin, and a drain region on the bottom semiconductor layer and adjacent a second side of the channel fin opposite the first side.

16 Claims, 8 Drawing Sheets

(56) References Cited

U.S. PATENT DOCUMENTS

| | | |
|---|---|---|
| 7,923,346 B2 | 4/2011 | Curatola et al. |
| 8,048,723 B2 | 11/2011 | Chang et al. |
| 8,053,299 B2 | 11/2011 | Xu |
| 8,124,465 B2 | 2/2012 | Yagishita et al. |
| 8,124,513 B2 | 2/2012 | Lin |
| 8,174,073 B2 | 5/2012 | Lee et al. |
| 8,236,632 B2 | 8/2012 | Fried et al. |
| 8,236,661 B2 | 8/2012 | Dennard et al. |
| 8,264,032 B2 | 9/2012 | Yeh et al. |
| 8,361,847 B2 | 1/2013 | Johnson et al. |
| 8,395,195 B2 | 3/2013 | Chang et al. |
| 8,450,775 B2 | 5/2013 | Chong et al. |
| 2005/0272190 A1 | 12/2005 | Lee et al. |
| 2009/0184341 A1 | 7/2009 | Chong et al. |
| 2010/0264468 A1 | 10/2010 | Xu |
| 2011/0068407 A1 | 3/2011 | Yeh et al. |
| 2012/0228672 A1 | 9/2012 | Daval et al. |
| 2013/0026539 A1 | 1/2013 | Tang et al. |
| 2013/0056795 A1 | 3/2013 | Wu et al. |
| 2013/0069126 A1 | 3/2013 | Huang et al. |
| 2013/0207166 A1 | 8/2013 | Chen et al. |
| 2013/0264653 A1 | 10/2013 | Cai et al. |

OTHER PUBLICATIONS

Chang et al. "Germanium gate-all-around pFETs on SOI", *Electrochemical Society Trans.*, vol. 50, No. 9, pp. 31-37, 2013 (Abstract Only).

FINFET SEMICONDUCTOR DEVICES INCLUDING RECESSED SOURCE-DRAIN REGIONS ON A BOTTOM SEMICONDUCTOR LAYER AND METHODS OF FABRICATING THE SAME

CROSS-REFERENCE TO RELATED APPLICATION

This application claims priority under 35 U.S.C. §120 to U.S. Provisional Application Ser. No. 61/908,905, entitled GE FINFET ON INSULATOR WITH RECESSED SOURCE DRAINS AND LOW OFF-STATE LEAKAGE, filed in the USPTO on Nov. 26, 2013, the disclosure of which is incorporated herein by reference in its entirety.

FIELD

Some embodiments of the inventive concept relate generally to semiconductor devices and, more particularly, to finFET semiconductor devices and methods of forming the same.

BACKGROUND

Germanium-on-insulator (GeOI) finFET structures have been developed to increase carrier mobility for pFET and nFET, as well as to reduce sub-fin leakage current due to the use of a bottom insulator layer directly under the channel fin. However, a pure GeOI finFET structure, formed with 100% germanium (Ge) in the entire finFET structure, may have increased off-state leakage due to band-to-band-tunneling (BTBT) associated with a small bandgap of pure Ge. One approach to reduce BTBT leakage is to add silicon (Si) to the Ge film to form a SiGe material composition. The SiGe material composition may have an increased bandgap that may significantly reduce the BTBT leakage. However, adding a constant percentage of Si throughout the entire GeOI finFET may result in overall lower channel mobility than desired and thus worse performance of the GeOI finFET structure.

Figure 1:
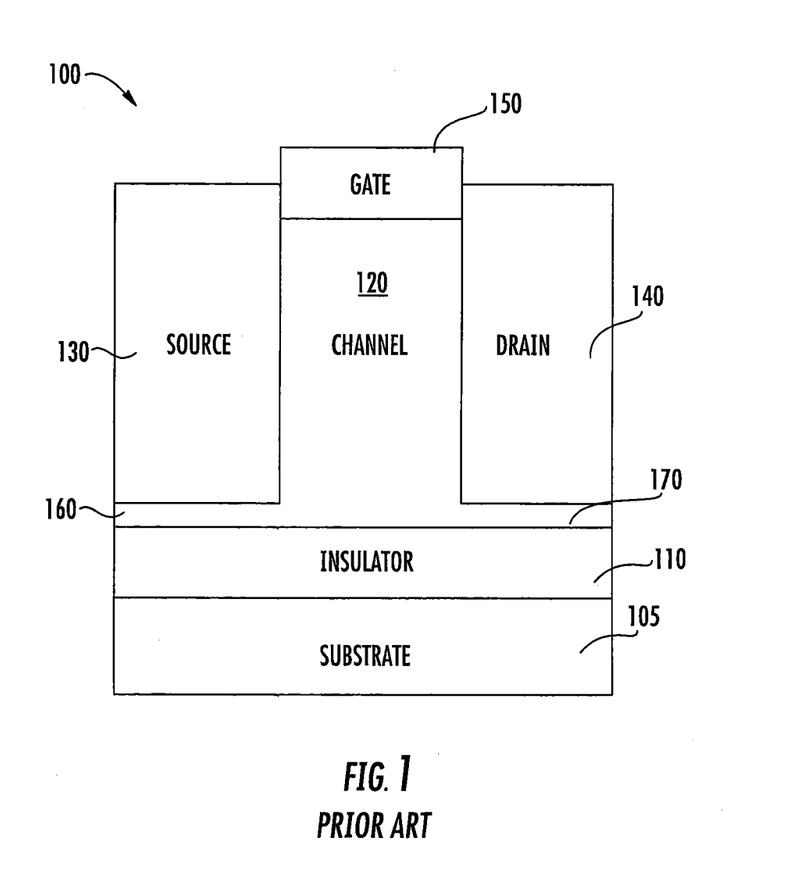

Reference is now made to FIG. 1 which is a cross sectional view schematically illustrating a conventional GeOI finFET semiconductor device. A conventional GeOI finFET semiconductor device 100 may include a substrate 105 and an insulator layer 110 disposed on the substrate 105. The conventional GeOI finFET semiconductor device 100 may also include a channel region 120 having a fin shape. The conventional GeOI finFET semiconductor device 100 may include a gate stack 150 on a top surface of the channel region 120 and extending down sidewall surfaces of the fin. Regions on sides of the channel region 120 may be removed by a recess etch and a source region 130 and a drain region 140 may be epitaxially regrown in the recessed regions on opposing sides of the channel region 120. The source region 130 and drain region 140 may include a higher percentage of Si than the channel region 120 to reduce the BTBT leakage and increase performance. However, the insulator layer 110 may not be lattice matched to the epitaxial material of the source region 130 and the drain region 140. If the recess etch is a full recess etch to the insulator layer 110, there may be no remaining fin material at the bottom to serve as a template for epitaxial re-growth of SiGe of a higher percentage of Si to refill the recessed regions. Therefore, a partial recess etch may leave regions of fin material, 160 and 170, between the insulator layer 110 and the source and drain regions, 130 and 140, respectively. However, as the regions of fin material, 160 and 170, may have a lower percentage of Si than source and drain regions, 130 and 140, a bottom of the finFET structure may provide higher BTBT leakage.

Figure 2A:
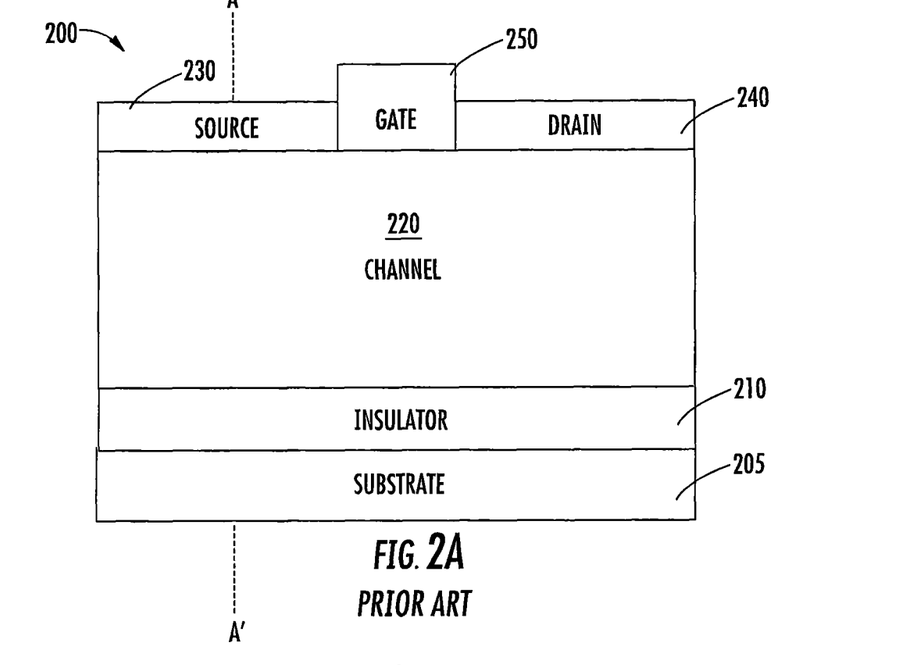
Figure 2B:
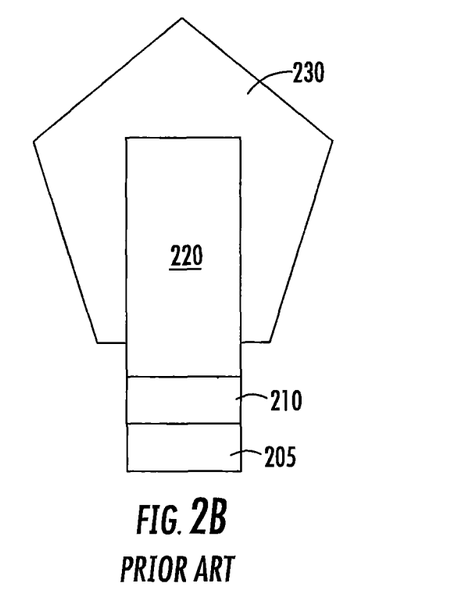
FIG. 2B is a cross-sectional view taken along the line A-A' of FIG. 2A.

Reference is now made to FIGS. 2A and 2B which are a cross sectional view schematically illustrating another conventional GeOI finFET semiconductor device and a cross-sectional view taken along the line A-A' of FIG. 2A, respectively. A conventional GeOI finFET semiconductor device 200 may include a substrate 205 and an insulator layer 210 disposed on the substrate 205. The conventional GeOI finFET semiconductor device 200 may also include a channel region 220 having a fin shape. The conventional GeOI finFET semiconductor device 200 may include a gate stack 250 on a top surface of the channel region 220 and extending down sidewall surfaces of the fin. A source region 230 and a drain region 240 may be epitaxially grown around the fin on opposing sides of the channel region 220. The source and drain regions, 230 and 240, may include a higher percentage of Si than the channel region 220 to reduce the BTBT leakage and increase performance. However, as the regions of fin material that source and drain regions, 230 and 240, are grown around may have a lower percentage of Si than source and drain regions, 130 and 140, a bottom of the finFET structure, or substantially the entire finFET structure, may provide higher BTBT leakage.

SUMMARY

According to some embodiments of the inventive concept, finFET semiconductor devices are provided. A finFET semiconductor device may include an insulator layer, a bottom semiconductor layer on the insulator layer, a channel fin on the bottom semiconductor layer, a source region on the bottom semiconductor layer and adjacent a first side of the channel fin, and a drain region on the bottom semiconductor layer and adjacent a second side of the channel fin that is opposite the first side. The bottom semiconductor layer may include a first percentage of a first semiconductor material and a second semiconductor material. The channel fin may include a second percentage of the first semiconductor material and the second semiconductor material. The second percentage of the first semiconductor material in the channel fin may be less than the first percentage of the first semiconductor material in the bottom semiconductor layer. The source region may include a third percentage of the first semiconductor material and the second semiconductor material. The third percentage of the first semiconductor material in the source region may be greater than the second percentage of the first semiconductor material in the channel fin. The drain region may include a fourth percentage of the first semiconductor material and the second semiconductor material. The fourth percentage of the first semiconductor material in the drain region may be greater than the second percentage of the first semiconductor material in the channel fin.

The first semiconductor material may be silicon and the second semiconductor material may be germanium.

The third and fourth percentages of the first semiconductor material in the source and drain regions may be less than or equal to the first percentage of the first semiconductor material in the bottom semiconductor layer.

The third and fourth percentages of the first semiconductor material in the source and drain regions may be about equal to the first percentage of the first semiconductor material in the bottom semiconductor layer.

The bottom semiconductor layer may include a thickness in a range of about 5 nm to about 15 nm and the channel fin may include a thickness in a range of about 10 nm to about 75 nm.

The bottom semiconductor layer may include a thickness of about 5 nm and the channel fin may include a thickness of about 35 nm.

A channel of the finFET semiconductor device may include the channel fin and a first portion of the bottom semiconductor layer beneath the channel fin. A source of the finFET semiconductor device may include the source region and a second portion of the bottom semiconductor layer beneath the source region. A drain of the finFET semiconductor device may include the drain region and a third portion of the bottom semiconductor layer beneath the drain region.

The finFET semiconductor device may include a gate stack on a top surface of the channel fin and extending down sidewall surfaces of the channel fin.

The drain region may be on a recessed portion of the bottom semiconductor layer. A distance between adjacent surfaces of the drain region and the insulator layer may be less than a distance between adjacent surfaces of the channel fin and the insulator layer.

The first percentage of the first semiconductor material in the bottom semiconductor layer may be in a range of about 10% to about 40%. The fourth percentage of the first semiconductor material in the drain region may be in a range of about 10% to about 40% and less than or equal to the first percentage of the first semiconductor material in the bottom semiconductor layer. The second percentage of the first semiconductor material in the channel fin may be in a range of about 5% to about 35% and less than the fourth percentage of the first semiconductor material in the drain region.

The third percentage of the first semiconductor material in the source region may be about equal to the fourth percentage of the first semiconductor material in the drain region.

The finFET semiconductor device may be an n-type finFET. The drain region may include a lower drain region adjacent the bottom semiconductor layer and an upper drain region on the lower drain region. The upper drain region may include an upper drain percentage of the first semiconductor material in the upper drain region that may be higher than a lower drain percentage of the first semiconductor material in the lower drain region.

The finFET semiconductor device may be a p-type finFET. The drain region may include a lower drain region adjacent the bottom semiconductor layer and an upper drain region on the lower drain region. The upper drain region may include an upper drain percentage of the first semiconductor material in the upper drain region that may be less than a lower drain percentage of the first semiconductor material in the lower drain region.

The finFET semiconductor device may be a p-type finFET. The drain region may include a lower drain region adjacent the bottom semiconductor layer and an upper drain region on the lower drain region. The upper drain region may include silicon and germanium, wherein an upper drain percentage of the silicon in the upper drain region may be less than a lower drain percentage of silicon in the lower drain region, and/or the upper drain region may include germanium and tin, wherein a percentage of tin in the upper drain region may be less than or equal to about 20%.

The channel fin, source region, and drain region of the finFET semiconductor device may be a first channel fin, a first source region, and a first drain region, respectively, of an n-type finFET. The finFET semiconductor device may further include a p-type finFET. The p-type finFET may include a second channel fin, a second source region, and a second drain region, each on the bottom semiconductor layer. Percentages of the first semiconductor material in the second channel fin, the second source region, and the second drain region may be each about equal to the second, third, and fourth percentages, respectively, of the first semiconductor material.

The channel fin, source region, and drain region of the finFET semiconductor device may be a first channel fin, a first source region, and a first drain region, respectively, of an n-type finFET. The finFET semiconductor device may further include a p-type finFET. The p-type finFET may include a second channel fin, a second source region, and a second drain region, each on the bottom semiconductor layer. Percentages of the first semiconductor material in the second channel fin, the second source region, and the second drain region may be each different from the second, third, and fourth percentages, respectively, of the first semiconductor material.

The channel fin, source region, and drain region of the finFET semiconductor device may be a first channel fin, a first source region, and a first drain region, respectively, of an n-type finFET. The finFET semiconductor device may further include a p-type finFET. The p-type finFET may include a second channel fin, a second source region, and a second drain region, each on the bottom semiconductor layer. At least one of percentages of the first semiconductor material in the second channel fin, the second source region, and the second drain region may be different from the second, third, and fourth percentages, respectively, of the first semiconductor material.

The different at least one of the percentages of the first semiconductor material in the second channel fin, the second source region, and the second drain region may be a product of a masked Ge condensation process that decreases a percentage of silicon in the bottom semiconductor layer and/or the channel fin of the n-type finFET.

According to other embodiments of the inventive concept, methods of forming finFET semiconductor devices are provided. The methods may include forming a donor wafer including a first substrate, a first layer including $Si_yGe_{1-y}$ on the substrate, and a second layer including $Si_xGe_{1-x}$, x>y, on the first layer. The methods may include forming a cleaving surface in the donor wafer between the substrate and at least a portion of the first layer. The methods may include forming an insulator layer on a second substrate. The methods may include bonding the donor wafer to the insulator layer with the second layer adjacent the insulator layer. The methods may include cleaving the donor wafer at the cleaving surface.

In some embodiments, the methods may include etching the first and second layers to form a fin. The methods may include forming a dummy gate on a channel portion of the fin between first and second exposed portions of the fin not covered by the dummy gate. The methods may include recessing the first and second exposed portions of the fin. The methods may include forming a source region in the recessed first exposed portion and a drain region in the recessed second exposed portion, wherein portions of the source and drain regions include $Si_zGe_{1-z}$, z>y. In some embodiments, z≤x.

In some embodiments, a thickness of the second layer may be substantially less than a thickness of the first layer and a lattice constant of the second layer may be substantially the same as a lattice constant of the first layer.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

FIGS. 1-2A are cross sectional views schematically illustrating conventional GeOI finFET semiconductor devices.

FIGS. 5A-7 are cross-sectional views illustrating stages of a method of manufacturing the finFET semiconductor device of FIG. 3A.

DETAILED DESCRIPTION OF THE EMBODIMENTS

Embodiments are described in detail with reference to the accompanying drawings. The inventive concept, however, may be embodied in various different forms, and should not be construed as being limited only to the illustrated embodiments set forth herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

The terminology used herein is for the purpose of describing particular embodiments only and is not intended to be limiting of the inventive concept. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element such as a layer, region or substrate is referred to as being "on" another element, it can be directly on the other element or intervening elements may be present. It will be further understood that when an element such as a layer, region or surface is referred to as being "adjacent" another element, it can be directly adjacent the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Example embodiments of aspects of the present inventive concept explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices, such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Figure 3A:
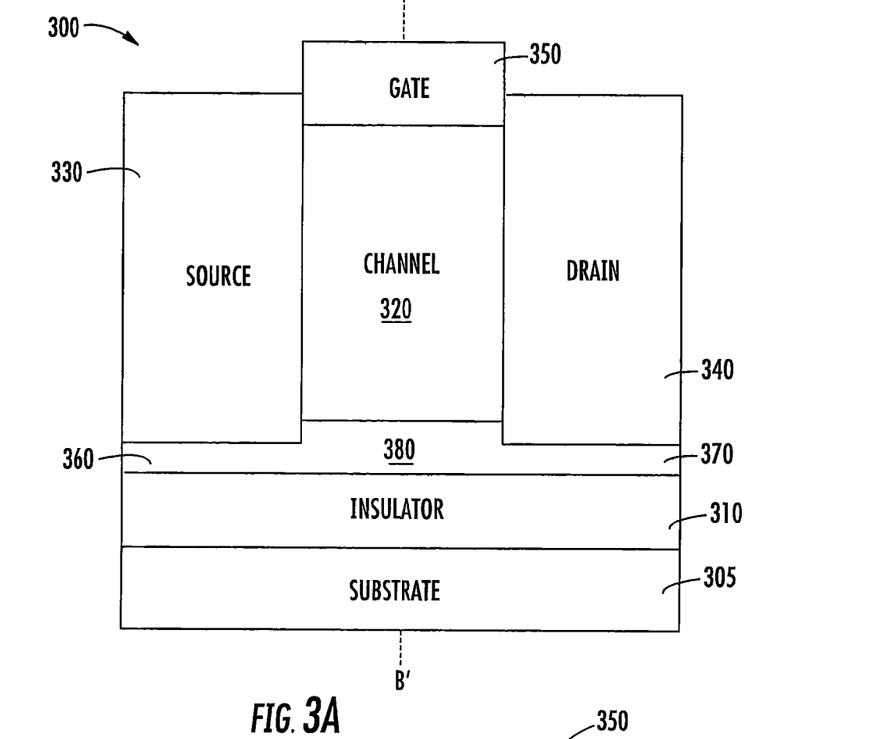
FIG. 3A is a cross sectional view schematically illustrating a finFET semiconductor device according to some embodiments of the inventive concept.
Figure 3B:
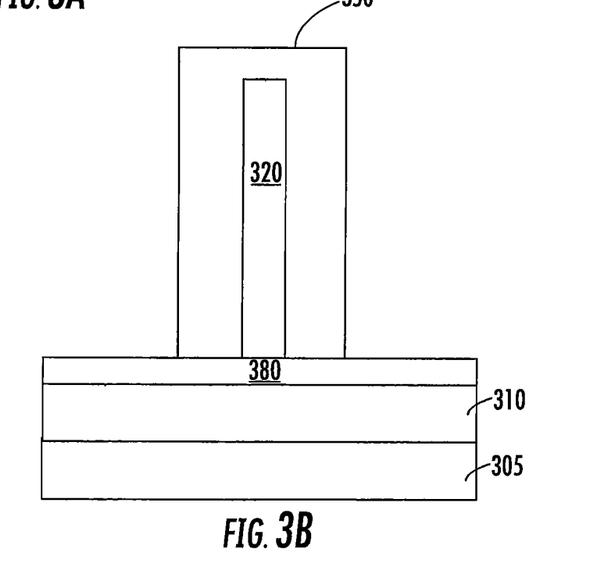
FIG. 3B is a cross-sectional view taken along the line B-B' of FIG. 3A.

Reference is now made to FIGS. 3A and 3B which are a cross sectional view schematically illustrating a finFET semiconductor device and a cross-sectional view taken along the line B-B' of FIG. 3A, respectively, according to some embodiments of the inventive concept. In some embodiments, a finFET semiconductor device 300 may include a substrate 305 and an insulator layer 310 disposed on the substrate 305. A bottom semiconductor layer 380 may be provided on the insulator layer 310. A fin-shaped channel region 320 may be provided on the bottom semiconductor layer 380. A gate stack 350 may be provided on a top surface of the channel region 320 and may extend down sidewall surfaces of the fin. Source and drain regions, 330 and 340, may be provided on the bottom semiconductor layer 380 on opposing sides of the channel region 320.

The bottom semiconductor layer 380, channel region 320, source region 330, and drain region 340 may each include first and second semiconductor materials. Some embodiments may provide that the first semiconductor material may be silicon (Si) and the second semiconductor material may be germanium (Ge). Aspects of the inventive concept will be described in relation to Si and Ge, however other materials may be used, such as a combination of Ge and tin (Sn).

The relative percentages of the first and second semiconductor materials may be different in the various regions. For example, the bottom semiconductor layer 380 may include $Si_xGe_{1-x}$, including a percentage x % of Si. The channel region 320 may include $Si_yGe_{1-y}$, including a percentage y % of Si. The source and drain regions, 330 and 340, may each include $Si_zGe_{1-z}$, including a percentage z % of Si.

In some embodiments, various regions may not be uniform in composition. In other words, a region may have an uneven percentage of Si and/or Ge throughout the region. For example, there may be intermixing of Si, Ge, or other elements between various regions during manufacturing or processing of the finFET semiconductor device. In some embodiments, the composition of a portion of a region and/or an entire region of a finFET semiconductor device may differ from the composition of that portion and/or region during intermediate stages of manufacturing or processing.

In some embodiments, a percentage of Si in the channel region 320 may be less than a percentage of Si in the source and drain regions, 330 and 340. For example, the channel region 320 may include a percentage y % of Si. For example, the percentage y % of Si in the channel region 320 may be in a range of about 5% to about 35%. The source and drain regions, 330 and 340, may include a percentage z % of Si that may be higher than the percentage y % of Si in the channel region 320. For example, the percentage z % of Si in the source and drain regions, 330 and 340, may be in a range of about 10% to about 40%. The bottom semiconductor layer 380 may include a percentage x % of Si that may be higher than the percentage y % of Si in the channel region 320 and, in some embodiments, may be higher than or equal to the percentage z % of Si in the source and drain regions, 330 and 340. For example, the percentage x % of Si in the bottom semiconductor layer 380 may be in a range of about 10% to about 40%.

The bottom semiconductor layer 380 may extend below the source region 330 to provide a bottom source region 360 of the bottom semiconductor layer 380 beneath the source region 330. In some embodiments, a source of the finFET semiconductor device 300 may include the source region 330 and the bottom source region 360. Similarly, the bottom semiconductor layer 380 may extend below the drain region 340 to provide a bottom drain region 370 of the bottom semiconductor layer 380 beneath the drain region 340. In some embodiments, a drain of the finFET semiconductor device 300 may include the drain region 340 and the bottom drain region 370. The bottom source and drain regions, 360, and 370, may include the percentage x % of Si in the bottom semiconductor layer 380. Because the source and drain regions, 330 and 340, and the bottom source and drain regions, 360 and 370, have percentages of Si that are higher than the percentage y % of Si in the channel region 320, the finFET semiconductor device 300 may include higher percentages of Si throughout the source and drain. Therefore, the finFET semiconductor device may provide lower BTBT leakage.

The bottom semiconductor layer 380 may be thin relative to a thickness of the channel region 320. For example, the bottom semiconductor layer 380 may include a thickness in a range of about 5 nm to about 15 nm and the channel region 320 may include a thickness in a range of about 10 nm to about 75 nm. In some embodiments, the bottom semiconductor layer 380 may include a thickness of about 5 nm and the channel region 320 may include a thickness of about 35 nm.

Figure 4:
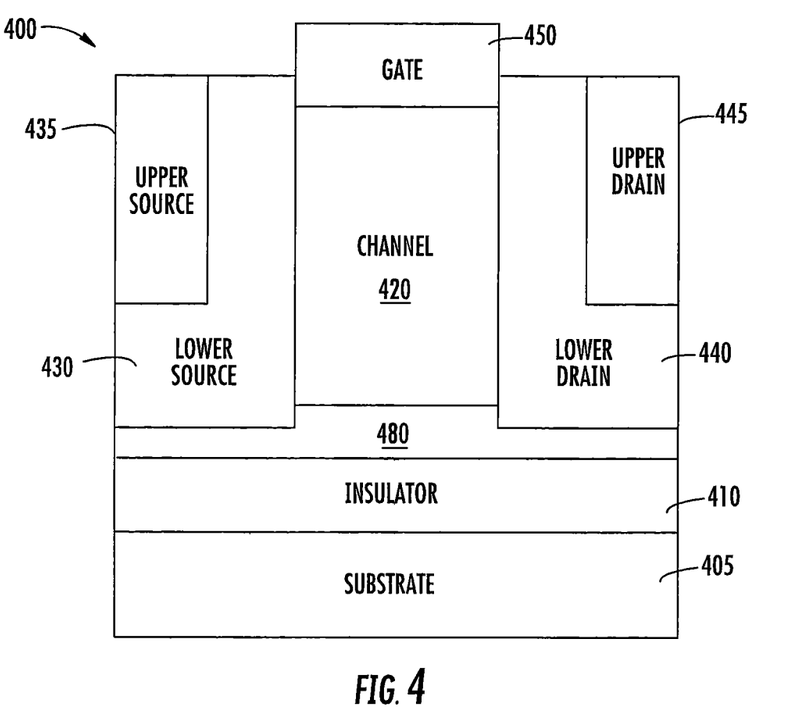
FIG. 4 is a cross sectional view schematically illustrating a finFET semiconductor device according to some embodiments of the inventive concept.

Reference is now made to FIG. 4 which is a cross sectional view schematically illustrating a finFET semiconductor device according to some embodiments of the inventive concept. As illustrated, a finFET semiconductor device 400 may be substantially similar to the finFET semiconductor device 300 of FIGS. 3A-3B except a source of the finFET semiconductor device 400 may include a lower source region 430 adjacent the bottom semiconductor layer 480 and an upper source region 435 on the lower source region 430. Similarly, a drain of the finFET semiconductor device 400 may include a lower drain region 440 adjacent the bottom semiconductor layer 480 and an upper drain region 445 on the lower drain region 440.

The lower source and drain regions, 430 and 440, may include $Si_zGe_{1-z}$, including z % of Si. The upper source and drain regions, 435 and 445, may include $Si_{z*}Ge_{1-z*}$, including z*% of Si, different from the percentage z % of Si in the lower source and drain regions, 430 and 440. In some embodiments, the finFET semiconductor device 400 may be an n-type finFET and the percentage z*% of Si in the upper source and drain regions, 435 and 445, may be higher than the percentage z % of Si in the lower source and drain regions, 430 and 440. In some embodiments, the finFET semiconductor device 400 may be a p-type finFET and the percentage z*% of Si in the upper source and drain regions, 435 and 445, may be lower than the percentage z % of Si in the lower source and drain regions, 430 and 440. In some embodiments of the inventive concept, the finFET semiconductor device 400 may be a p-type finFET, the upper source and drain regions, 435 and 445, may include GeSn. For example, a percentage of Sn in the upper source and drain regions, 435 and 445, may be less than or equal to 20%. In some embodiments of the inventive concept, a percentage of Si or Sn may vary across the source and drain regions. For example, the percentage of Si or Sn may vary across the source and drain regions in a gradient with the percentage being higher adjacent the bottom semiconductor layer 480 and lower remote from the bottom semiconductor layer 480, or vice versa.

Figure 8:
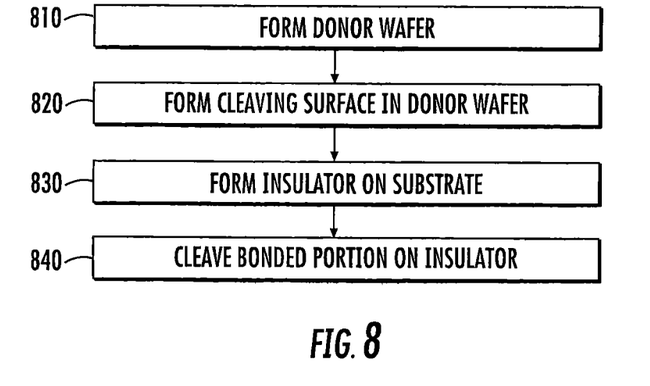
FIG. 8 is a flowchart illustrating a method of manufacturing the semiconductor on insulator of FIG. 5B.
Figure 9:
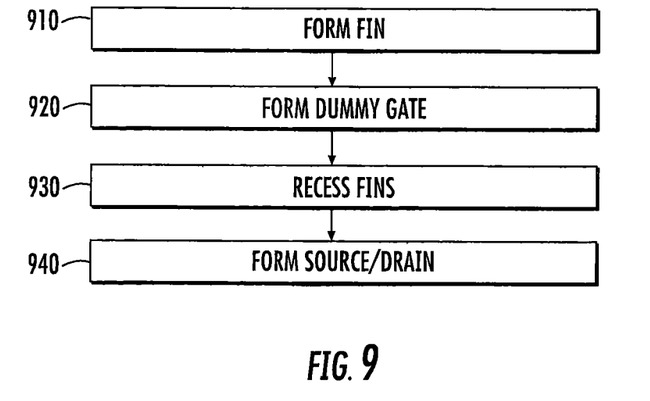
FIG. 9 is a flowchart illustrating a method of manufacturing the finFET semiconductor device of FIG. 3A.

FIGS. 5A-7 are cross-sectional views illustrating stages corresponding to methods of manufacturing the finFET semiconductor device of FIG. 3A. FIG. 8 is a flowchart illustrating operations in methods of manufacturing the semiconductor on insulator of FIG. 5B. FIG. 9 is a flowchart illustrating operations in methods of manufacturing the finFET semiconductor device of FIG. 3A.

Figure 5A:
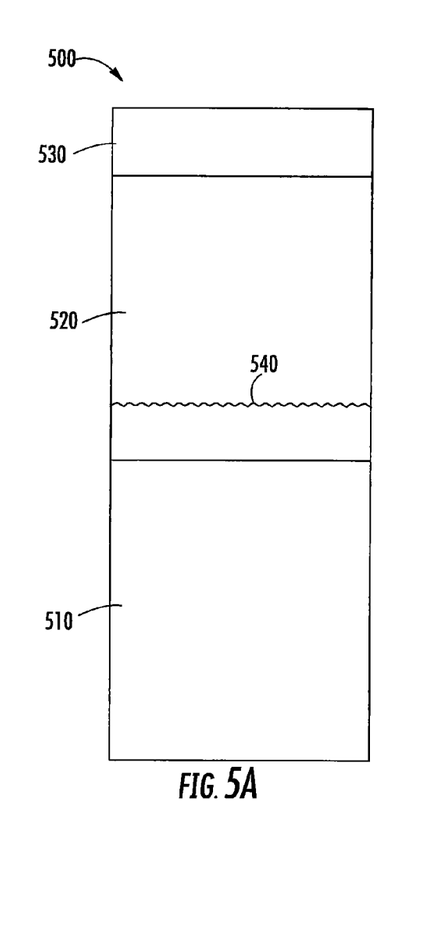

Referring to FIG. 5A and FIG. 8, a SiGe donor wafer 500 may be formed (block 810). The donor wafer 500 may include a buffer layer 510. A $Si_yGe_{1-y}$ layer 520 may be formed on the buffer layer 510. A thickness of the $Si_yGe_{1-y}$ layer 520 may be at least a thickness of the desired final channel region 320 of FIG. 3A. A $Si_xGe_{1-x}$ layer 530 may be formed on the $Si_yGe_{1-y}$ layer 520. A thickness of the $Si_xGe_{1-x}$ layer 530 may be about the thickness of the desired final bottom semiconductor layer 380 of FIG. 3A. Some embodiments provide that the $Si_yGe_{1-y}$ and $Si_xGe_{1-x}$ layers, 520 and 530, may be formed by epitaxial growth. A lattice constant of the $Si_yGe_{1-y}$ layer 520 may be substantially the same as a lattice constant of the $Si_xGe_{1-x}$ layer 530. In some embodiments, an insulator layer, such as an oxide layer, may be formed on layer 530.

A cleaving surface 540 may be formed in the donor wafer 500 (block 820). The cleaving surface 540 may be at a depth along the $Si_yGe_{1-y}$ layer 520.

Figure 5B:
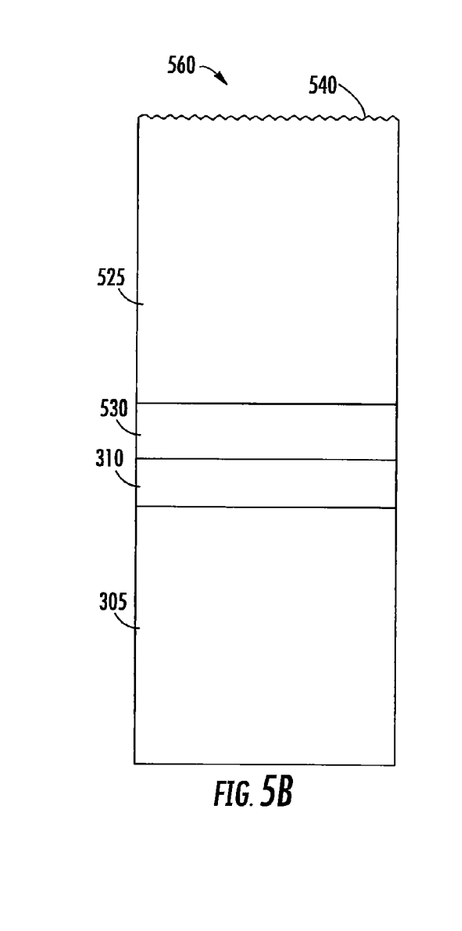

Referring to FIG. 5B and FIG. 8, an insulator layer 310 may be formed on a substrate 305 (block 830). The substrate 305 may be a Si substrate. The insulator layer may be an oxide layer. The donor wafer 500 of FIG. 5A may be bonded on the insulator layer 310 and then cleaved along cleaving surface 540 to form a semiconductor on insulator 560 (block 840). For example, the cleaving process may be performed using Smart Cut™ engineered wafer technology. The donor wafer 500 may be flipped over prior to bonding to provide that the $Si_xGe_{1-x}$ layer 530 may be adjacent the insulator layer 310.

In some embodiments, the insulator layer 310 may be formed on the $Si_xGe_{1-x}$ layer 530 instead of on the substrate 305. In such embodiments, the donor wafer 500 may be bonded on the substrate 305 to form the semiconductor on insulator. In such embodiments, the donor wafer 500 may be flipped over prior to bonding to provide that the insulator layer 310 may be adjacent the substrate 305. In some embodiments, the insulator layer 310 may be formed both on the $Si_xGe_{1-x}$ layer 530 and on the substrate 305. In such embodiments, the donor wafer 500 may be flipped over prior to bonding to provide that the insulator layers 310 may be adjacent.

Figure 6:
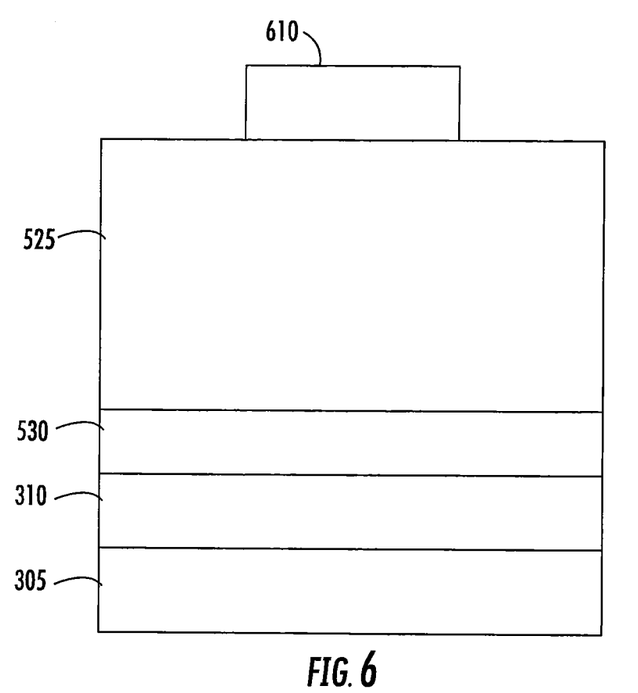

Referring to FIG. 6 and FIG. 9, the $Si_yGe_{1-y}$ and $Si_xGe_{1-x}$ layers, 525 and 530, may be patterned and etched to form a $Si_yGe_{1-y}/Si_xGe_{1-x}$ fin on the insulator layer 310 (block 910). A dummy gate 610 may be formed over and along sidewalls of the fin (block 920). In some embodiments, sidewall spacers may be formed on sidewalls of the dummy gate 610. In some embodiments the sidewall spacers may extend on sidewalls of the dummy gate 610 from a height from the substrate that is greater than or equal to a height of a top surface of the $Si_yGe_{1-y}$ layer 525 to a height from the substrate that is less than or equal to a height of a top surface of the dummy gate 610.

Figure 7:
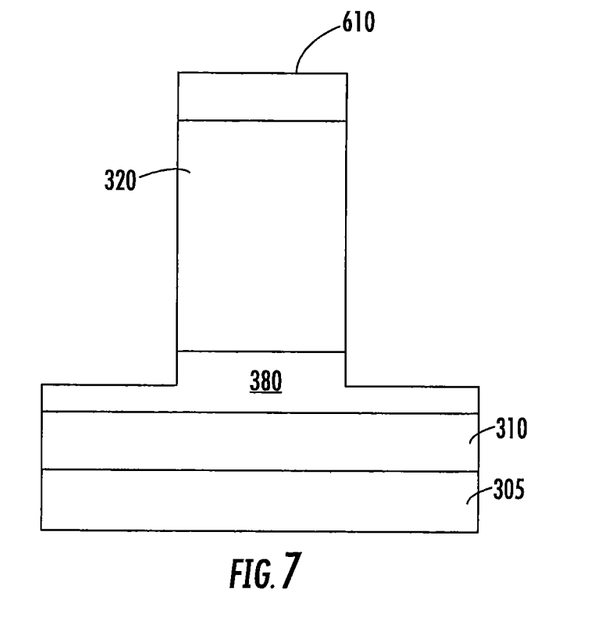

Referring to FIG. 7 and FIG. 9, regions of the $Si_yGe_{1-y}$ and $Si_xGe_{1-x}$ layers, 525 and 530, that are not protected by the dummy gate, may be recessed etched (block 930). In embodiments that include sidewall spacers, regions protected by the sidewall spacers may not be recessed etched. The regions of the $Si_yGe_{1-y}$ layer may be recessed completely to form the channel region 320. The regions of the $Si_zGe_{1-z}$ layers may be etched partially to form the bottom semiconductor layer 380.

Referring to FIGS. 3A-3B and FIG. 9, source and drain regions, 330 and 340, may be formed by an epitaxial regrowth of $Si_zGe_{1-z}$ (block 940). The dummy gate 610 of FIGS. 6-7 may be replaced with a gate stack 350 to form the finFET semiconductor device 300.

Figure 10:
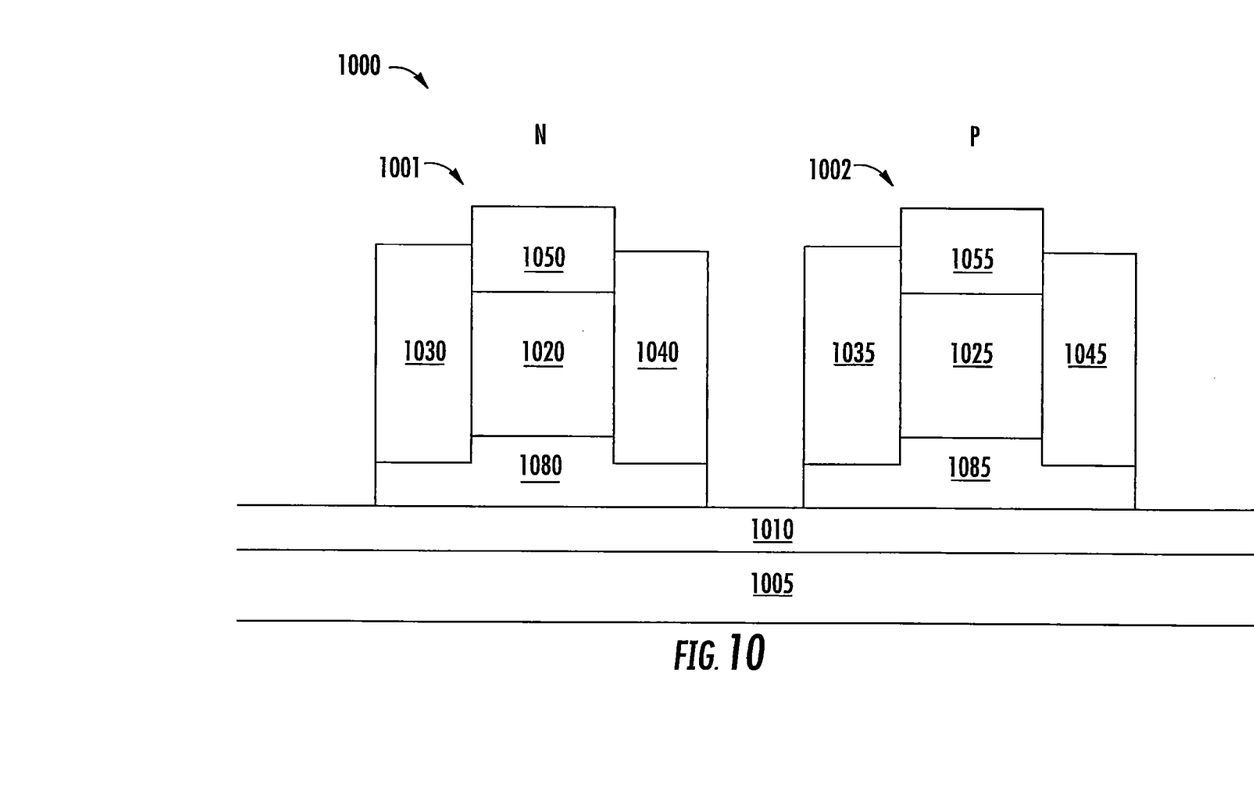
FIG. 10 is a cross-sectional view schematically illustrating a finFET semiconductor device including an n-type finFET and a p-type finFET according to some embodiments of the inventive concept.

Reference is now made to FIG. 10 which is a cross-sectional view schematically illustrating a finFET semiconductor device comprising an n-type finFET and a p-type finFET according to some embodiments of the inventive concept. A finFET semiconductor device 1000 may include a substrate 1005 and an insulator layer 1010 disposed on the substrate 1005. An n-type finFET 1001 may be disposed on the insulator layer 1010. The n-type finFET 1001 may include a bottom semiconductor layer 1080 on the insulator layer 1010. A fin-shaped channel region 1020 may be provided on the bottom semiconductor layer 1080. A gate stack 1050 may be provided on a top surface of the channel region 1020 and extending down sidewall surfaces of the fin. Source and drain regions, 1030 and 1040, may be provided on the bottom semiconductor layer 1080 on opposing sides of the channel region 1020.

The finFET semiconductor device 1000 may also include a p-type finFET 1002 disposed on the insulator layer. The p-type finFET 1002 may include a bottom semiconductor layer 1085 on the insulator layer 1010. A fin-shaped channel region 1025 may be provided on the bottom semiconductor layer 1085. A gate stack 1055 may be provided on a top surface of the channel region 1025 and extending down sidewall surfaces of the fin. Source and drain regions, 1035 and 1045, may be provided on the bottom semiconductor layer 1085 on opposing sides of the channel region 1025.

The n-type finFET 1001 and p-type finFET 1002 may each be substantially similar to the finFET semiconductor device 300 of FIG. 3A. In some embodiments, percentages of Si, x %, y %, and z %, of the n-type finFET 1001, as described in relation to the finFET semiconductor device 300 of FIG. 3A, may each be about equal to respective percentages of Si in the p-type finFET 1002. In some embodiments, the percentages of Si of the n-type finFET 1001 may each be different from the respective percentages of Si in the p-type finFET 1002.

In some embodiments, at least one of the percentages of Si, x %, y %, and/or z %, of the n-type finFET 1001 may be different from at least one of the corresponding percentages of Si in the p-type finFET 1002. A percentage of Si of the n-type finFET 1001 that is different from a corresponding percentage of Si in the p-type finFET may result from a masked Ge condensation process. For example, the masked Ge condensation process may decrease a percentage of Si in the bottom semiconductor layer 1080 and/or the channel region 1020 of the n-type finFET.

While the inventive concept has been described with reference to some embodiments, it will be apparent to those skilled in the art that various changes and modifications may be made without departing from the spirit and scope of the inventive concept. For example, some embodiments have been described with the percentage of Si in the source region equal to the percentage of Si in the drain region, however differences in the percentages of Si in the source and drain regions may exist for various regions including, for example, process variations. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A finFET semiconductor device, comprising:
   an insulator layer;
   a bottom semiconductor layer on the insulator layer, the bottom semiconductor layer comprising a first percentage of a first material and a fifth percentage of a second semiconductor material;
   a channel fin on the bottom semiconductor layer, the channel fin comprising a second percentage of the first material and a sixth percentage of the second semiconductor material, wherein the second percentage of the first material in the channel fin is less than the first percentage of the first material in the bottom semiconductor layer;
- a source region on the bottom semiconductor layer and adjacent a first side of the channel fin, the source region comprising a third percentage of the first material and a seventh percentage of the second semiconductor material, wherein the third percentage of the first material in the source region is greater than the second percentage of the first material in the channel fin; and
- a drain region on the bottom semiconductor layer and adjacent a second side of the channel fin that is opposite the first side, the drain region comprising a fourth percentage of the first material and an eighth percentage of the second semiconductor material, wherein the fourth percentage of the first material in the drain region is greater than the second percentage of the first material in the channel fin,
- wherein the first material is silicon and the second semiconductor material is germanium.

2. The finFET semiconductor device of claim 1, wherein the third and fourth percentages of the first material in the source and drain regions are less than or equal to the first percentage of the first material in the bottom semiconductor layer.

3. The finFET semiconductor device of claim 1, wherein the third and fourth percentages of the first material in the source and drain regions are about equal to the first percentage of the first material in the bottom semiconductor layer.

4. The finFET semiconductor device of claim 1, wherein the bottom semiconductor layer comprises a thickness in a range of about 5 nm to about 15 nm and the channel fin comprises a thickness in a range of about 10 nm to about 75 nm.

5. The finFET semiconductor device of claim 4, wherein the bottom semiconductor layer comprises a thickness of about 5 nm and the channel fin comprises a thickness of about 35 nm.

6. The finFET semiconductor device of claim 1,
- wherein a channel of the finFET semiconductor device comprises the channel fin and a first portion of the bottom semiconductor layer beneath the channel fin,
- wherein a source of the finFET semiconductor device comprises the source region and a second portion of the bottom semiconductor layer beneath the source region, and
- wherein a drain of the finFET semiconductor device comprises the drain region and a third portion of the bottom semiconductor layer beneath the drain region.

7. The finFET semiconductor device of claim 6, further comprising a gate stack on a top surface of the channel fin and extending down sidewall surfaces of the channel fin.

8. The finFET semiconductor device of claim 7, wherein the drain region is on a recessed portion of the bottom semiconductor layer, wherein a distance between adjacent surfaces of the drain region and the insulator layer is less than a distance between adjacent surfaces of the channel fin and the insulator layer.

9. The finFET semiconductor device of claim 8,
- wherein the first percentage of the first material in the bottom semiconductor layer is in a range of about 10% to about 40%,
- wherein the fourth percentage of the first material in the drain region is in a range of about 10% to about 40% and less than or equal to the first percentage of the first material in the bottom semiconductor layer, and
- wherein the second percentage of the first material in the channel fin is in a range of about 5% to about 35% and less than the fourth percentage of the first material in the drain region.

10. The finFET semiconductor device of claim 1,
- wherein the finFET semiconductor device is an n-type finFET,
- wherein the drain region comprises a lower drain region adjacent the bottom semiconductor layer and a upper drain region on the lower drain region, and
- wherein the upper drain region comprises an upper drain percentage of the first material in the upper drain region that is higher than a lower drain percentage of the first material in the lower drain region.

11. The finFET semiconductor device of claim 1,
- wherein the finFET semiconductor device is a p-type finFET,
- wherein the drain region comprises a lower drain region adjacent the bottom semiconductor layer and a upper drain region on the lower drain region, and
- wherein the upper drain region comprises an upper drain percentage of the first material in the upper drain region that is less than a lower drain percentage of the first material in the lower drain region.

12. The finFET semiconductor device of claim 1,
- wherein the channel fin, source region, and drain region comprise a first channel fin, a first source region, and a first drain region, respectively, of an n-type finFET,
- wherein the finFET semiconductor device further comprises a p-type finFET,
- wherein the p-type finFET comprises a second channel fin, a second source region, and a second drain region, each on the bottom semiconductor layer, and
- wherein percentages of the first material in the second channel fin, the second source region, and the second drain region are about equal to the second, third, and fourth percentages, respectively, of the first material.

13. The finFET semiconductor device of claim 1,
- wherein the channel fin, source region, and drain region comprise a first channel fin, a first source region, and a first drain region, respectively, of an n-type finFET,
- wherein the finFET semiconductor device further comprises a p-type finFET,
- wherein the p-type finFET comprises a second channel fin, a second source region, and a second drain region, each on the bottom semiconductor layer, and
- wherein percentages of the first material in the second channel fin, the second source region, and the second drain region are different from the second, third, and fourth percentages, respectively, of the first material.

14. The finFET semiconductor device of claim 1,
- wherein the channel fin, source region, and drain region comprise a first channel fin, a first source region, and a first drain region, respectively, of an n-type finFET,
- wherein the finFET semiconductor device further comprises a p-type finFET,
- wherein the p-type finFET comprises a second channel fin, a second source region, and a second drain region, each on the bottom semiconductor layer, and
- wherein at least one of percentages of the first material in the second channel fin, the second source region, and the second drain region is different from the second, third, and fourth percentages, respectively, of the first material.

15. The finFET semiconductor device of claim 14, wherein the different at least one of the percentages of the first material in the second channel fin, the second source region, and the second drain region is a product of a masked Ge condensation process that decreases a percentage of silicon in the bottom semiconductor layer and/or the channel fin of the n-type finFET.

16. The finFET semiconductor device of claim 1, wherein a sum of the first percentage and the fifth percentage is approximately 1, a sum of the second percentage and the sixth percentage is approximately 1, a sum of the third percentage and the seventh percentage is approximately 1, and a sum of the fourth percentage and the eighth percentage is approximately 1.

* * * * *